(12) United States Patent
Wang et al.

(10) Patent No.: US 11,367,649 B2
(45) Date of Patent: *Jun. 21, 2022

(54) SEMICONDUCTOR SUBSTRATE POLISHING METHODS

(71) Applicant: GlobalWafers Co., Ltd., Hsinchu (TW)

(72) Inventors: Hui Wang, Wildwood, MO (US);
Vandan Tanna, O'Fallon, MO (US);
Tracy Michelle Ragan, Warrenton, MO (US); James Raymond Capstick, Florissant, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,370

(22) Filed: Sep. 29, 2020

(65) Prior Publication Data

US 2021/0013092 A1 Jan. 14, 2021

Related U.S. Application Data

(60) Continuation of application No. 16/150,000, filed on Oct. 2, 2018, now Pat. No. 10,811,307, which is a division of application No. 15/221,839, filed on Jul. 28, 2016, now Pat. No. 10,128,146.

(60) Provisional application No. 62/207,701, filed on Aug. 20, 2015.

(51) Int. Cl.
| | | |
|---|---|---|
| H01L 21/762 | (2006.01) |
| H01L 21/306 | (2006.01) |
| C09G 1/02 | (2006.01) |
| C09K 3/14 | (2006.01) |
| H01L 21/02 | (2006.01) |

(52) U.S. Cl.
CPC .......... H01L 21/76254 (2013.01); C09G 1/02 (2013.01); C09K 3/1436 (2013.01); C09K 3/1463 (2013.01); H01L 21/02024 (2013.01); H01L 21/30625 (2013.01)

(58) Field of Classification Search
CPC ......... H01L 21/76254; H01L 21/02024; H01L 21/30625; C09K 3/1436; C09K 3/1463; C09G 1/02
See application file for complete search history.

(56) References Cited

U.S. PATENT DOCUMENTS

| | | |
|---|---|---|
| 5,189,500 A | 2/1993 | Kusunkoi |
| 5,436,175 A | 7/1995 | Nakato |
| 6,361,407 B1 | 3/2002 | Lu et al. |
| 6,583,029 B2 | 6/2003 | Abe |
| 6,790,747 B2 | 9/2004 | Henley |
| 8,330,245 B2 | 12/2012 | Pitney |
| 8,440,541 B2 | 5/2013 | Pitney |
| 9,524,874 B2 | 12/2016 | Venkataraman et al. |
| 2002/0187595 A1 | 12/2002 | Walitzki et al. |
| 2006/0032146 A1 | 2/2006 | Partch et al. |
| 2009/0013609 A1 | 1/2009 | Gupta et al. |

(Continued)

OTHER PUBLICATIONS

SEMI M69: Practice for Determining Wafer Near-Edge Geometry using Roll-off Amount, ROA (Preliminary) (2007).

(Continued)

*Primary Examiner* — Anita K Alanko
(74) *Attorney, Agent, or Firm* — Armstrong Teasdale LLP (57) ABSTRACT

Polishing slurries for polishing semiconductor substrates are disclosed. The polishing slurry may include first and second sets of colloidal silica particles with the second set having a silica content greater than the first set.

12 Claims, 9 Drawing Sheets

(56) References Cited

U.S. PATENT DOCUMENTS

| | | |
|---|---|---|
| 2011/0204471 A1 | 8/2011 | Pitney |
| 2012/0248578 A1 | 10/2012 | Masuda |
| 2015/0102012 A1 | 4/2015 | Reiss et al. |
| 2016/0122590 A1 | 5/2016 | Lew et al. |
| 2017/0226381 A1 | 8/2017 | Lan et al. |

OTHER PUBLICATIONS

Kimura et al., A New Method for the Precise Measurement of Wafer Roll off of Silicon Polished Wafer, Jpn. Jo. Appl. Phys., vol. 38, pp. 38-39 (1999).

Fujimi Incorporated, Ganzox Silicon Polish (publicly available before Aug. 8, 2015).

SEMICONDUCTOR SUBSTRATE POLISHING METHODS

CROSS-REFERENCE TO RELATED APPLICATIONS

This application is a continuation of U.S. patent application Ser. No. 16/150,000, filed Oct. 2, 2018, which is a divisional of U.S. patent application Ser. No. 15/221,839, filed Jul. 28, 2016, now U.S. Pat. No. 10,128,146, which claims the benefit of U.S. Provisional Patent Application No. 62/207,701, filed Aug. 20, 2015, each of which being incorporated herein by reference in its entirety.

FIELD OF THE DISCLOSURE

The field of the disclosure relates to slurries for polishing semiconductor substrates and, in particular, polishing slurries that reduce the roll-off amount for substrates used to produce silicon on insulator structures.

BACKGROUND

Silicon on insulator structures ("SOI structures" which may also be referred to herein as "SOI wafers" or "SOI substrates") generally include a handle wafer, a silicon layer (also characterized as a "device layer"), and a dielectric layer (such as an oxide layer) between the handle wafer and the silicon layer. Transistors built within the top silicon layer of SOI structures switch signals quickly compared to transistors built on bulk silicon wafers, run at lower voltages and are much less vulnerable to signal noise from background cosmic ray particles. Each transistor is isolated from its "neighbor" or nearby transistor by a complete layer of silicon dioxide. These transistors are generally immune to "latch-up" problems and can be spaced closer together than transistors built on bulk silicon wafers. Building circuits on SOI structures increases productivity by allowing for more compact circuit designs, yielding more chips per wafer.

SOI structures may be prepared from silicon wafers sliced from single crystal silicon ingots grown in accordance with the Czochralski method. In one method for preparing a SOI structure, a dielectric layer is deposited on a polished front surface of a donor wafer. Ions are implanted at a specified depth beneath the front surface of the donor wafer to form a cleave plane, which is generally perpendicular to the axis, in the donor wafer at the specified depth at which they were implanted. The front surface of the donor wafer is then bonded to a handle wafer and the two wafers are pressed to form a bonded wafer. A portion of the donor wafer is then cleaved along the cleave plane to remove a portion of the donor wafer leaving behind a thin silicon layer (i.e., the device layer) to form the SOI structure.

A lack of bonding or weak bonding between the dielectric layer and the handle wafer at the periphery of the bonded structure causes the dielectric layer and/or the silicon layer at the periphery to be removed during subsequent cleaving. This results in a SOI structure that has a silicon layer (and typically also a dielectric layer) with a smaller radius than the handle wafer. The peripheral region of the structure that does not include the silicon layer is not available for device fabrication and is also a potential source of particle contamination. This unusable peripheral region may have a width of at least 1 mm or even 1.5 mm or more in 200 mm wafers and may include at least about 2.5% of the SOI structure's surface area.

There is a need for methods for manufacturing SOI wafers that allow the silicon layer of the structure to extend further to the edge of the handle wafer.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the disclosure is directed to a method for polishing a semiconductor substrate. The substrate has a front surface and a back surface generally parallel to the front surface. The front surface of the substrate is contacted with a polishing pad in the presence of a polishing slurry. The polishing slurry includes a first set of silica particles that have a silica content of $X_1$ wt %. The slurry also includes a second set of silica particles that are polymer-encapsulated and have a silica content of $X_2$ wt %. $X_2$ is greater than $X_1$.

Another aspect of the disclosure is directed to a polishing slurry for polishing a semiconductor wafer. The polishing slurry includes a first set of silica particles having a silica content of $X_1$ wt %. The slurry also includes a second set of silica particles. The second set of silica particles are polymer-encapsulated and have a silica content of $X_2$ wt %. $X_2$ is greater than $X_1$.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Multi-layered structures and, in particular, silicon on insulator structures and methods for producing silicon on insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and then delaminated (i.e., cleaved) along a separation plane that is different from the bond interface and which has been formed via an implantation technique. One structure is typically referred to as the "handle" wafer (or structure) and the other is typically referred to as the "donor" wafer (or structure).

The donor and/or handle wafers used to produce the SOI structure may be composed of single crystal silicon and may be obtained by slicing the wafers from ingots formed by the Czochralski process. The donor and handle wafer (and resulting SOI structure) each include a central axis, a front surface and a back surface parallel to the front surface, the front and back surfaces being generally perpendicular to the central axis, a circumferential edge joining the front and back surfaces and a radius extending from the central axis to the circumferential edge. The handle wafer and/or the donor wafer used in accordance with the present disclosure may be any diameter suitable for use by those of skill in the art including, for example, 200 mm, 300 mm, greater than 300 mm or even 450 mm diameter wafers. In some embodiments, the donor wafer and the handle wafer are 200 mm in diameter.

In one or more embodiments for preparing the donor wafer and/or handle wafer, a polishing step is performed in which the front surface is polished to achieve a desired surface roughness. The polishing step may be a single-side polish (i.e., the back surface is not polished) which is typical for processing of 200 mm substrates. The single-side polish may reduce the surface roughness of the wafer to less than about 2.0 Å as measured by atomic force microscopy (AFM) at scan sizes of about 10 μm×about 10 μm to about 100 μm×about 100 μm. The single-side polish may even reduce the surface roughness to less than about 1.5 Å or less than about 1.2 Å at scan sizes of about 10 μm×about 10 μm to about 100 μm×about 100 μm.

The single-side polish may result in removal of at least about 1 μm of material from the front surface of the substrate and typically at least about 5 μm or even 10 μm or more (e.g., from about 1 μm to about 20 μm and, more typically, from about 5 μm to about 20 μm or 10 to about 20 μm of material from the surface of the wafer). Removal of 1 μm of material or more from the front surface of the substrate is typical of 200 mm substrate processing in which a single polishing step is performed. 300 mm substrate processing may involve two polishing steps (a "rough" double side polish with about 10 to about 20 μm of material being removed and a "finish" or "mirror" single side polish with less than 1 μm of material being removed).

The single-side polish may be achieved by, for example, chemical-mechanical planarization (CMP). CMP typically involves the immersion of the wafer in an abrasive slurry and polishing of the wafer by a polymeric pad. Through a combination of chemical and mechanical means the surface of the wafer is smoothed. Typically the polish is performed until a chemical and thermal steady state is achieved and until the wafers have achieved their targeted shape and flatness.

Suitable polishers for the single-side polish may be obtained from Lapmaster SFT (e.g., LGP-708, Chiyoda-Ku, Japan). In accordance with embodiments of the present disclosure, the pad used for single-side polishing is a suede-type pad (also referred to as a polyurethane foam pad) such as a SURFIN pad from Fujimi (Kiyoso, Japan), a CIEGAL pad from Chiyoda KK (Osaka, Japan) or a SPM pad from Rohm and Haas. Polyurethane impregnated polyethylene pads such as SUBA pads available from Rohm and Haas may also be used.

The single-side polish may occur for at least about 60 seconds or even about 90, 120 or 180 seconds or more. The slurry flow rate may range from about 500 ml/min to about 750 ml/min and the pad pressure may range from about 75 $g/cm^2$ to about 125 $g/cm^2$; however, it should be understood that other polish times, pad pressures and slurry flow rates may be used without departing from the scope of the present disclosure.

In some embodiments of the present disclosure, the single-side polishing slurry is a polydisperse slurry that includes a first set of colloidal silicon particles and a second set of colloidal silica particles. The first and second sets of silica particles may be amorphous silica and are generally spherical. The first set of silica particles has a silica content of $X_1$ and the second set has a silica content of $X_2$ with $X_2$ being greater than $X_1$. The silica content of the particles may be varied by individually encapsulating the particles of at least one set with a polymer with the degree of encapsulation (i.e., thickness of polymer) being different between the two sets. The polymer reduces the silica content within the set of particles. In some embodiments, the ratio of $X_2$ to about $X_1$ is at least about 2:1 or even at least about 3:1, at least about 5:1, at least about 10:1 or even at least about 15:1. The difference between $X_2$ and about $X_1$ (i.e., $X_2$ minus $X_1$) may be about 5 wt %, at least about 10 wt %, at least about 25 wt % or at least about 50 wt %.

In some embodiments, the silica particles of the first set are individually encapsulated in a polymer and the first set includes less than about 25 wt % silica or, as in other embodiments, less than about 15 wt %, less than about 10 wt %, from about 1 wt % to about 25 wt %, from about 1 wt % to about 15 wt % or from about 1 wt % to about 10 wt % silica.

The second set of silica particles may also be individually polymer encapsulated. The second set of polymer-encapsulated silica particles may comprise at least about 50 wt % silica or at least about 60 wt %, at least about 70 wt %, from about 50 wt % to about 95 wt %, from about 60 wt % to about 95 wt % or from about 70 wt % to about 90 wt % silica.

The first set of silica particles and the second set of silica particles may be used in a weight ratio (including silica and polymer) from about 5:1 to about 1:5 or from about 3:1 to about 1:3, from about 2:1 to about 1:2 or from about 4:3 to about 3:4.

The polymers used for encapsulation may be any of the polymers conventionally used in the field of substrate polishing and, in particular, silicon wafer polishing. The polymer may be a water-soluble polymer such as cellulose, substituted-cellulose, modified starches or xanthan gum.

Both the first and second sets of silica particles have an average particle size. Generally the particle sizes are relatively similar to maintain polishing action of both sets. The difference in the average diameters between the first and second sets of silica particles may be less than less than about 30 nm, less than about 20 nm or less than about 10 nm. The average diameters of the particles of both sets may be less than about 100 nm, less than about 50 nm, from about 10 nm to about 50 nm, from about 20 nm to about 40 nm or from about 30 nm to about 40 nm. In some embodiments, the average diameter of the first set of particles is about 35 nm and/or the average diameter of the second set of particles is about 30 nm.

The polishing slurry is generally a polydisperse colloid in which the two sets of solid-phase silica particles are dispersed in a liquid phase. Suitable liquid phases include aqueous solutions. The slurry may include additional components typical of polishing slurries used to polish single crystal silicon wafers. The slurry may be prepared by mixing a first solution containing the first set of silica particles with a second solution containing the second set of silica particles. For example, the solution may be prepared by separately introducing the two solutions to the polishing tool and mixing the solutions at the polishing pad. In other embodiments, the polishing slurry is prepared outside of the polisher.

At least one of the handle wafer and the donor wafer are single-side polished with the polydisperse polishing slurry (i.e., the slurry containing both the first set and second set of silica particles) before assembly of the silicon-on-insulator structure. In some embodiments, both the handle wafer and donor wafer are polished with the polydisperse polishing slurry.

In some embodiments, the single side polish process includes contacting the front surface of the wafer with different polishing slurries at various intervals (e.g., to remove the bulk of material in a first step, remove material with roll-off improvement in a second step and to clean and remove minor scratches in a third step). In some instances, the substrate is (1) contacted with a first polishing slurry containing silica particles of the second set (and not of the first set); (2) contacted with a second polishing slurry containing the first set of silica particles and the second set of silica particles; and (3) contacted with a third polishing slurry containing silica particles of the first set (and not of the second set). Each sequential polishing step may be from about 10 seconds to about 3 minutes in length.

After the single-side polish is complete, the wafers may be rinsed and dried. In addition, the wafers may be subjected to a wet bench or spin cleaning. Wet bench cleaning may include contacting the wafers with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

The silicon on insulator structure may be prepared from the single-side polished donor and handle wafers by any of the conventional methods for preparing such structures. A dielectric layer may be deposited on the surface of the donor wafer, the handle wafer or both, prior to bonding the donor and handle together. In this regard, the SOI structures and methods for preparing the SOI structures are described herein as having a dielectric layer deposited or grown on the donor wafer and as having the surface of the handle wafer bonded to the surface of the dielectric layer. However, it should be understood that the dielectric layer may be grown or deposited on the handle wafer alternatively or in addition to growing or depositing the dielectric layer on the donor wafer and that these structures may be bonded in any of the various arrangements without limitation. Reference herein to the dielectric layer being disposed on the handle wafer alone should not be considered in a limiting sense.

Typically, at least the donor wafer and more typically both the donor wafer and the handle wafer are composed of single crystal silicon wafers, however it should be noted that other starting structures may be used such as multi-layered and/or heterolayered structures without departing from the present disclosure. Generally, the polishing methods described above are suitable for SOI substrate preparation. The polishing methods may also be used for other purposes (e.g., bulk wafer production). In some embodiments, the substrate that is polished is a polysilicon substrate.

Figure 1:
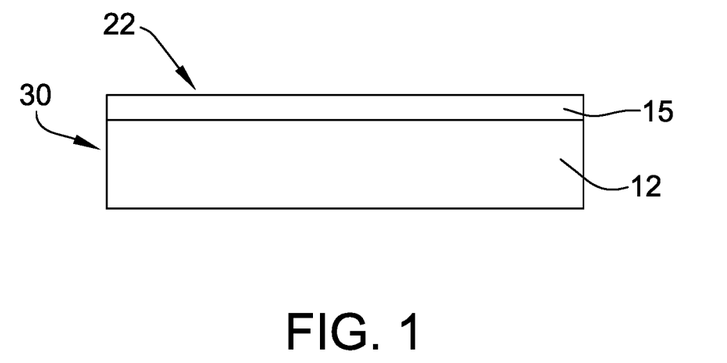
FIG. 1 is a cross-section view of a donor structure with a dielectric layer thereon.

Referring to FIG. 1, a dielectric layer 15 (e.g., a silicon oxide and/or silicon nitride layer) is deposited on a polished front surface of a donor wafer 12. The dielectric layer 15 may be applied according to any known technique in the art, such as thermal oxidation, wet oxidation, thermal nitridation or a combination of these techniques. Generally speaking, the dielectric layer 15 is grown to a substantially uniform thickness sufficient to provide the desired insulating properties in the final structure. Typically, however, the dielectric layer has a thickness of at least about 1 nm and less than about 500 nm, less than about 300 nm, less than about 200 nm, less than about 150 nm, less than about 100 nm or even less than about 50 nm. The dielectric layer 15 may be any electrically insulating material suitable for use in a SOI structure, such as a material comprising $SiO_2$, $Si_3N_4$, aluminum oxide, or magnesium oxide. In one embodiment, the dielectric layer 15 is $SiO_2$ (i.e., the dielectric layer consists essentially of $SiO_2$). However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide.

In this regard it should be understood that, while the SOI structures are described herein as having a dielectric layer, in some embodiments the dielectric layer is eliminated and the handle wafer and donor wafer are "direct bonded." Reference herein to such dielectric layers should not be considered in a limiting sense. Any one of a number of techniques known to those of skill in the art may be used to produce such direct bonded structures.

Figure 2:
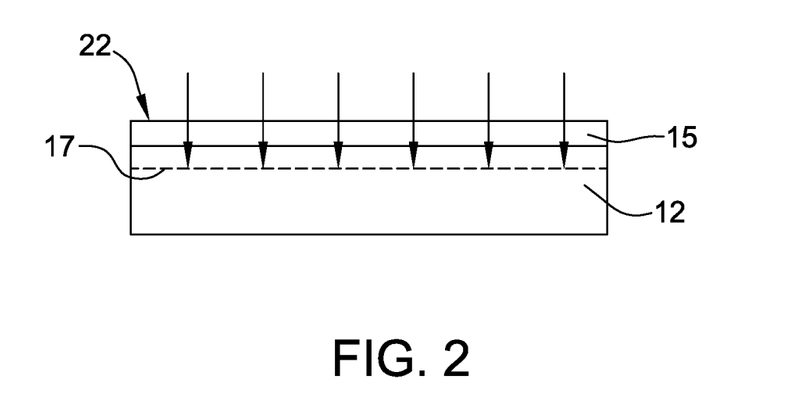
FIG. 2 is cross-section view of the donor structure during ion implantation.

Ions (e.g., hydrogen atoms, helium atoms or a combination of hydrogen and helium atoms) are implanted at a substantially uniform specified depth beneath the front surface of the donor wafer to define a cleave plane 17 (FIG. 2). It should be noted, that when combinations of ions are implanted, they may be implanted concurrently or sequentially. Ion implantation may be achieved using means known in the art. For example, this implantation may be achieved in a manner similar to the process disclosed in U.S. Pat. No. 6,790,747. Implantation parameters may include, for example, implantation of ions to a total dose of about $1 \times 10^{15}$ to about $5 \times 10^{16}$ ions/cm$^2$ at a total energy of, for example, about 20 to about 125 keV (e.g., $H_2^+$ may be implanted at an energy of 20 keV and a dose of $2.4 \times 10^{16}$ ions/cm$^2$). When a combination of ions is used, the dose may be adjusted between the combination of ions accordingly (e.g., $He^+$ may be implanted at an energy of 36 keV and a dose of $1 \times 10^{16}$ ions/cm$^2$ followed by $H_2^+$ implanted at an energy of 48 keV and a dose of $5 \times 10^{15}$ ions/cm$^2$).

When implantation is performed prior to deposition of the dielectric layer, the subsequent growth or deposition of the dielectric layer on the donor wafer is suitably performed at a temperature low enough to prevent premature separation or cleaving along plane 17 in the donor layer (i.e., prior to the wafer bonding process step). The separation or cleaving temperature is a complex function of the implanted species, implanted dose, and implanted material. However, typically, premature separation or cleaving may be avoided by maintaining a deposition or growth temperature below about 500° C.

Figure 3:
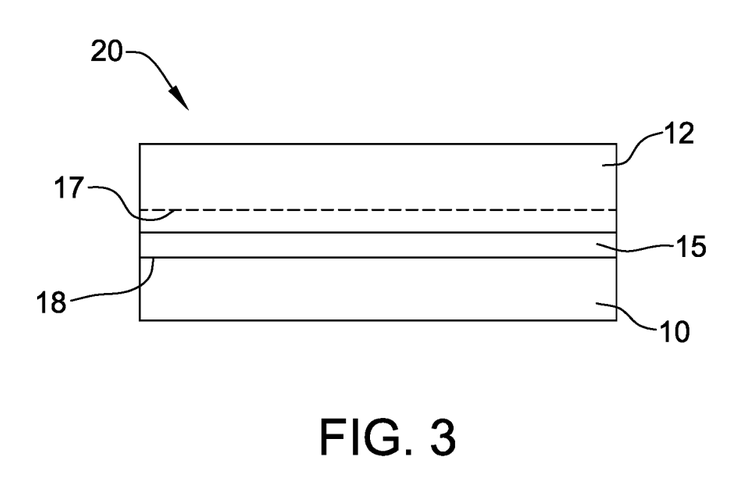
FIG. 3 is a cross-section view of the donor structure bonded to a handle structure.

Referring now to FIG. 3, the front surface of the dielectric layer 15 is then bonded to the front surface of a handle wafer 10 to form a bonded wafer 20 through a hydrophilic bonding process. The dielectric layer 15 and handle wafer 10 may be bonded together by exposing the surfaces of the wafers to a plasma containing, for example, oxygen or nitrogen. Exposure to the plasma modifies the structure of the surfaces in a process often referred to as surface activation. The wafers are then pressed together and a bond at the bond interface 18 is formed therebetween.

Prior to bonding, the surfaces of the dielectric layer and handle wafer may optionally undergo cleaning and/or a brief etching, planarization, or plasma activation to prepare their surfaces for bonding using techniques known in the art. Without being held to a particular theory, it is generally believed that the quality of the silicon surface of the SOI structure is, in part, a function of the quality of the surface prior to bonding. Additionally, the quality of both surfaces prior to bonding will have a direct impact on the quality or strength of the resulting bond interface.

In some instances, therefore, the dielectric layer and/or handle wafer may be subjected to polishing (as described above) and/or cleaning by, for example, a wet chemical cleaning procedure, such as a hydrophilic surface preparation process (e.g., an RCA SC-1 clean process wherein the surfaces are contacted with a solution containing ammonium hydroxide, hydrogen peroxide, and water at a ratio of, for example, 1:2:50 at about 65° C. for about 20 minutes, followed by a deionized water rinse and drying). One or both of the surfaces may also optionally be subjected to a plasma activation after, or instead of, the wet cleaning process to increase the resulting bond strength. The plasma environment may include, for example, oxygen, ammonia, argon, nitrogen, diborane, or phosphine.

Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Typically, however, wafer bonding is achieved by contacting the surface of the dielectric layer and the handle wafer at a reduced pressure (e.g., about 50 mTorr) and at room temperature, followed by heating at an elevated temperature (e.g., at least about 200° C., at least about 300° C., at least about 400° C., or even at least about 500° C.) for a sufficient period of time (e.g., at least about 10 seconds, at least about 1 minute, at least about 15 minutes, at least about 1 hour or even at least about 3 hours). For example, the heating may take place at about 350° C. for about 1 hour. The resulting interface may have a bond strength that is greater than about 500 $mJ/m^2$, greater than about 1000 $mJ/m^2$, greater than about 1500 $mJ/m^2$, or even greater than about 2000 $mJ/m^2$. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the ions earlier implanted in the donor wafer weaken the cleave plane. A portion of the donor wafer is then separated (i.e., cleaved) along the cleave plane from the bonded wafer to form the SOI structure.

Figure 4:
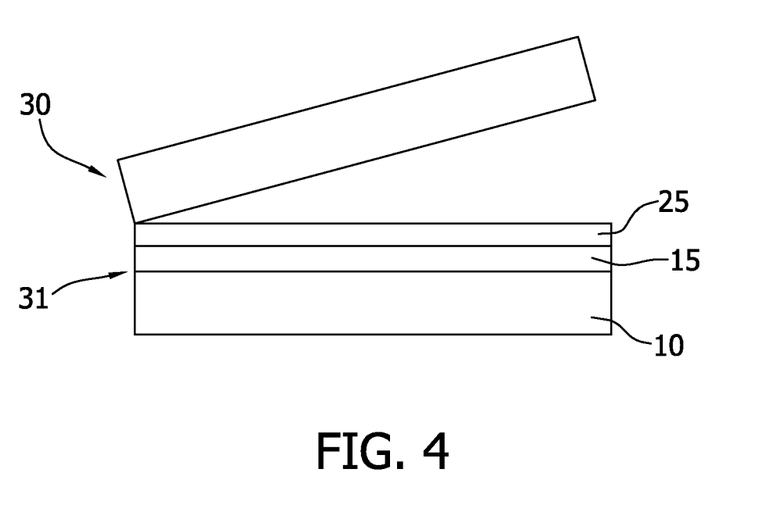
FIG. 4 is a cross-section view of a layered semiconductor structure upon cleaving the donor structure at the cleave plane.

After the bond interface has been formed, the resulting bonded structure is subjected to conditions sufficient to induce a fracture along the separation or cleave plane within the donor wafer (FIG. 4). Generally speaking, this fracture may be achieved using techniques known in the art, such as thermally and/or mechanically induced cleaving techniques. Typically, however, fracturing is achieved by annealing the bonded structure at a temperature of at least about 200° C., at least about 300° C., at least about 400° C., at least about 500° C., at least about 600° C., at least about 700° C. or even at least about 800° C. (the temperature being in the range of, for example, about 200° C. to about 800° C., or from about 250° C. to about 650° C.) for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions.

In this regard it is to be noted that in an alternative embodiment, this separation may be induced or achieved by means of mechanical force, either alone or in addition to annealing. For instance, the bonded wafer may be placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure.

Referring to FIG. 4, upon separation, two structures 30, 31 are formed. Since the separation of the bonded structure 20 occurs along the cleave plane 17 in the donor wafer 12 (FIG. 2), a portion of the donor wafer remains part of both structures (i.e., a portion of the donor wafer is transferred along with the dielectric layer). Structure 30 comprises a portion of the donor wafer. Structure 31 is the silicon on insulator structure and includes the handle wafer 16, the dielectric layer 15, and a silicon layer 25.

The resulting SOI structure 31 includes a thin layer of silicon 25 (the portion of the donor wafer remaining after cleaving) disposed atop the dielectric layer 15 and the handle wafer 10. The cleave surface of the SOI structure (i.e., the thin layer of silicon of the donor wafer) has a rough surface that may be smoothed by additional processing. The structure 31 may be subjected to additional processing to produce a silicon layer surface having desirable features for device fabrication thereon. Such features include, for example, reduced surface roughness, and/or a reduced concentration of light point defects.

In accordance with the present disclosure, the donor wafer and/or the handle wafer used to prepare the SOI structure have a roll-off amount (ROA) less than many conventional donor and/or handle wafers (and particularly 200 mm wafers) to improve the bonding between the dielectric layer and the handle wafer at the peripheral edge portions of the bonded structure. ROA may generally be determined by well-known industry measurement protocols. Particularly, ROA may be measured using the height data profile as disclosed by M. Kimura et al., "A New Method for the Precise Measurement of Wafer Roll off of Silicon Polished Wafer," *Jpn. Jo. Appl. Phys.*, vol. 38, pp. 38-39 (1999), which is incorporated herein by reference for all relevant and consistent purposes. Generally, the methods of Kimura have been standardized by the industry as by, for example, SEMI M69: Practice for Determining Wafer Near-Edge Geometry using Roll-off Amount, ROA (Preliminary) (2007) which is also incorporated herein by reference for all relevant and consistent purposes. Most commercially available wafer-inspection instruments are pre-programmed to calculate ROA. For instance ROA may be determined by use of a KLA-Tencor Wafer Inspection System using WaferSight analysis hardware (Milpitas, Calif.).

Figure 5:
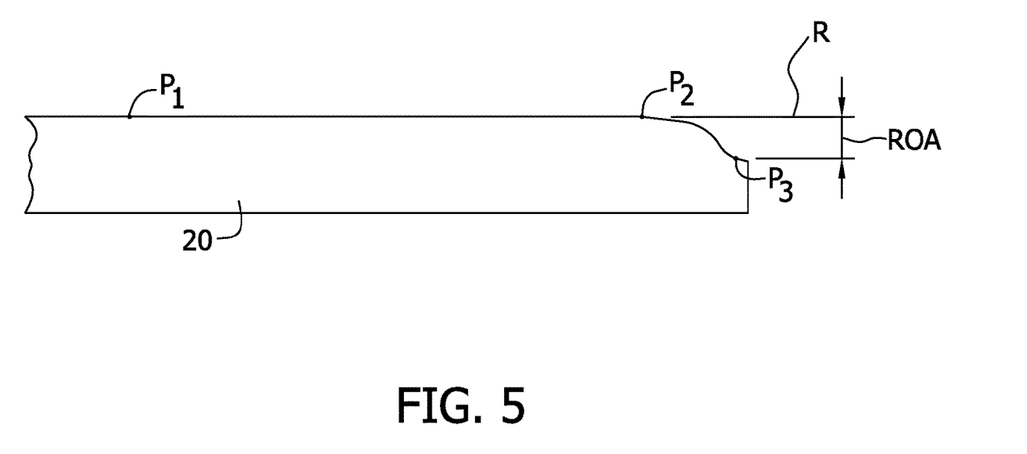
FIG. 5 is a cross-section view of a wafer schematically showing measurement of the roll-off amount.

With reference to FIG. 5, ROA of a wafer 20 is generally determined by reference to three points ($P_1$, $P_2$ and $P_3$) along a wafer radius. A reference line R is fitted between two points ($P_1$, $P_2$) and the third point ($P_3$) near the circumferential edge of the wafer where roll-off is conventionally observed. The ROA is the distance between the reference line R and the third point $P_3$. The reference line R may be fitted as a first order linear line or a third order polynomial. For purposes of the present disclosure, the reference line is fitted as a first order linear line unless stated differently.

In this regard, ROA may be expressed in terms of front surface ROA, back surface ROA or thickness ROA (i.e., using an average thickness profile). Front surface ROA and back surface ROA measurements involve fitting a best-fit reference line R between $P_1$ and $P_2$ along the respective front or back surface and thickness ROA involves fitting a best fit line for the various wafer 20 thicknesses between $P_1$ and $P_2$ (i.e., the thickness ROA takes into account both the front and back surface). In this regard, it has been found that the thickness ROA better correlates to improved bonding in the bonded structure and to the distance to which the silicon layer extends to the wafer edge in the resulting SOI structure as compared to the front surface ROA. Roll-off amounts recited herein are thickness ROA measurements unless stated otherwise.

While any of three points may be chosen to determine ROA, one common method used in the art, particularly for 200 mm substrates, includes using a first point that is about 90% of the radius of the wafer from the central axis of the wafer and a second point that is about 94% of the radius from the central axis of the wafer to form the reference line R. These points are about 90 mm and 94 mm from the central axis of the wafer in a 200 mm diameter wafer. A third point about 96% of the radius of the wafer from the central axis (i.e., at about 96 mm from the central axis for a 200 mm diameter wafer) may be used with the distance between the reference line and the third point being ROA.

ROA may be measured across several radii of the wafer and averaged. For instance, the ROA of 2, 4 or 8 radii angularly spaced across the wafer may be measured and averaged. For instance, ROA may be measured by averaging the ROA of eight radii (e.g., the eight radii at 0°, 45°, 90°, 135°, 180°, 225°, 275° and 315° in the R-θ coordinate system as described in SEMI M69).

It should be understood that ROA, in regard to the thickness profile, may be a positive number in which the wafer becomes thicker nearer its circumferential edge or may be a negative number in which the wafer becomes less thick towards the circumferential edge. In this regard, use of the phrase "less than" herein in relation to an ROA amount (either negative or positive) indicates that the ROA is in a range from the recited amount to about 0 (e.g., an ROA of "less than about −70 nm" refers to an ROA range of about −70 nm to about 0 and an ROA of "less than about 70 nm" refers to an ROA in the range of about 70 nm to about 0). Additionally, use of the phrase "greater than" in relation to an ROA amount (either negative or positive) includes roll-off amounts in which the edge portion of the wafer is further away from the axial center of the wafer than the recited amount.

In accordance with embodiments of the present disclosure, 200 mm donor wafers and/or handle wafers processed with the polydisperse polishing slurry may have a ROA (measured with reference line formed at 90 mm and 94 mm compared to the thickness at 96 mm) of less than about −40 nm. In other embodiments, the ROA of the donor wafer is less than about −35 nm, less than about −20 nm, less than about 0 nm or from about −35 nm to about 25 nm.

Figure 6:
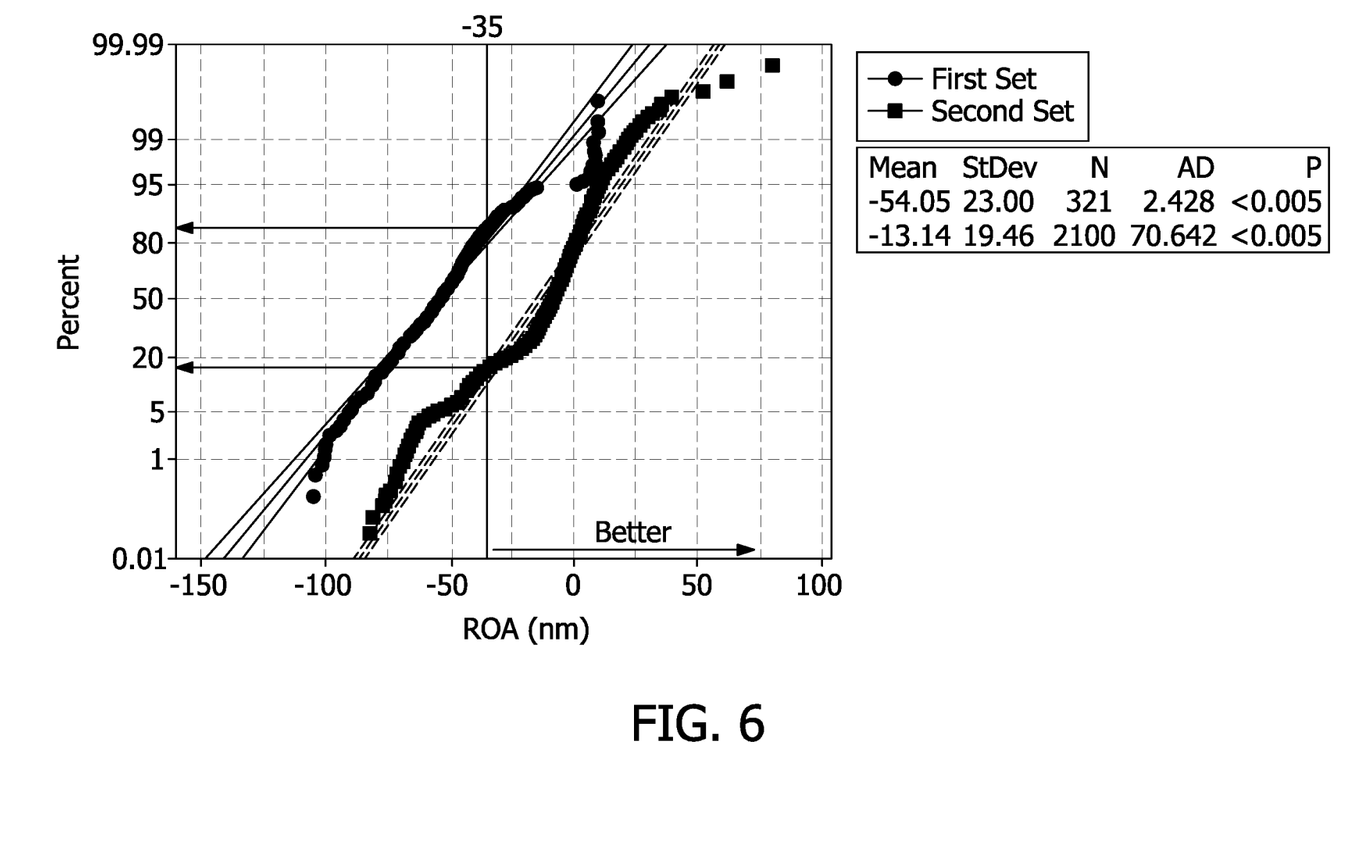
FIG. 6 is a probability plot of the roll-off amount of wafers polished according to Example 1.

With reference to FIG. 6, use of the polydisperse polishing slurry decreases the average ROA in a population of wafers. In embodiments in which a population of wafers (e.g., at least 5, 10, 25 or 100 or more wafers) is polished with the polishing slurry, at least about 20% of the wafers may have a roll-off amount of less than about −35 nm or even at least about 40%, at least about 60% or at least about 60% of the wafers have a roll-off amount of less than about −35 nm.

By reducing the ROA of the handle and/or donor wafers, bonding between the dielectric layer and the handle wafer at the peripheral edge portions of the bonded structure is improved (i.e., voids are reduced, bonded area is increased, and bonding extends closer to the circumferential edge) as compared to bonded structures that are produced from conventional handle and donor wafers. As a result of the improved bonding, the silicon layer of the resulting SOI structure extends closer to the edge of the handle wafer to which it is bonded after cleaving. In 200 mm bonded structures (i.e., before cleaving), the dielectric layer may at least be partially bonded to the handle wafer such that bonds extend from the central axis of the bonded silicon on insulator structure to at least 98.2 mm from the central axis of the bonded silicon on insulator structure and, in some embodiments, to at least about 98.5 mm or even at least about 98.6 mm from the central axis of the bonded structure (e.g., from about 98.2 mm to about 98.8 mm or from about 98.5 mm to about 98.8 mm).

To determine the extent to which bonding occurs in the bonded structure, the bonded wafer may be cleaved in half and analyzed or the resulting SOI structure may be analyzed for the presence of the silicon layer. In this regard, the phrase "at least partially bonded" may include arrangements in which bonds extend to the circumferential edge of the handle and/or donor wafer unless stated otherwise. In this regard it should be understood that, in certain embodiments, the radius of the handle wafer may differ from that that of the dielectric layer and/or the silicon layer (e.g., in the SOI structure after cleaving as a result of partial bonding) and, as used herein, the "radius of the SOI structure" refers to the radius of the handle wafer unless stated otherwise.

This increase in peripheral bonding in the bonded structure allows the silicon layer and the dielectric layer to extend closer to the circumferential edge of the handle wafer to which they are bonded in the resulting SOI structure. In several exemplary embodiments, the resulting SOI structure includes a silicon layer (and typically also a dielectric layer) that extends from the central axis of the handle wafer to about 98.2 mm from the central axis of the handle wafer and, in some embodiments, to at least about 98.5 mm or even at least about 98.6 mm from the central axis of the handle wafer structure (e.g., from about 98.2 mm to about 98.8 mm or from about 98.5 mm to about 98.8 mm).

The extent to which the silicon layer extends to the edge of the handle wafer may be determined by, for example, viewing the structure under an optical microscope (e.g., with a 5× objective) such as a Nomarski differential interference contrast (DIC) microscope.

In this regard, it should be understood that, as used herein, the width of the unbonded portion does not include the beveled region of the wafer. Stated differently, the unbonded region extends from the edge of the beveled region to the edge of the silicon layer rather than from the apex to the silicon layer edge.

The SOI structure formed after cleaving the donor wafer at the cleave plane may be characterized with RDA's at the various wafer interfaces that are substantially similar to the ROA of the handle wafer and/or donor wafer which are used to produce the SOI structure. In 200 mm wafers, the handle wafer may have an ROA (measured with reference line formed at 90 mm and 94 mm compared to the thickness at 96 mm) of less than about −40 nm at the interface with the dielectric layer. In other embodiments, the ROA of the handle wafer is less than about −35 nm, less than about −20 nm, less than about 0 nm or from about −35 nm to about 25 nm at the interface with the dielectric layer.

As compared to conventional methods for polishing substrates, methods of the present disclosure have several advantages. Use of a polishing slurry having two sets of colloidal silica particles with one set having a greater weight percentage of silica within the particles (and less polymer) may reduce the ROA of the wafer (e.g., at 96 mm from the central axis in 200 mm substrates). Silica particles having a thicker polymer coating have less polishing action at low pad pressures compared to silica particles having less or no polymer. Particles with less polymer act to polish more uniformly regardless of pad pressure. By including two sets of silica particles with different amounts of polymer, the polishing rate across the wafer may vary depending on whether roll-off is observed with at least some base-level polishing occurring across the wafer. At the center of the wafer where roll-off does not occur, the pad pressure allows both sets of particles to act to polish the wafer and remove material. At the edge of the wafer where roll-off is observed, the pad pressure is reduced which reduces the rate of polishing, particularly the rate attributed to the particles having more polymer.

Use of a polishing slurry having two sets of colloidal silica particles with one set having a greater amount of silica (and less polymer) may push the roll-off closer to the edge of the wafer, possibly even beyond a flatness inspection area. In this manner, the flatness relatively near the wafer edge is improved.

The polishing slurry may be particularly useful to reduce the ROA in single-side polishing processes in which at least about 5 μm or even at least 10 μm of material from the surface of the wafer is removed (which is typical of polishing of 200 mm diameter wafers). In embodiments in which silicon on insulators are produced, use of a polishing slurry having one set of silica particles with more polymer than the other set improves bonding in the bonded structure, particularly in embodiments in which both the donor and handle wafer are polished by the slurry.

EXAMPLES

The processes of the present disclosure are further illustrated by the following Examples. These Examples should not be viewed in a limiting sense.

Example 1: Effect of Polishing Slurry on ROA

A first set of single crystal silicon wafers (200 mm) were single-side polished with a polishing slurry containing polymer-encapsulated colloidal silica for about 240 seconds. The polishing slurry contained colloidal silica (23.6 wt %; Nalco DVSTS029) diluted with 76.4 wt % deionized water. The polishing slurry also included a small amount of 31 wt % $H_2O_2$ (about $2.7 \times 10^{-4}$ wt %). The polymer-encapsulated silica particles included about 80 wt % silica (with the remainder being polymer) and had an average particle diameter of about 30 nm. The first set was then single side polished for 30 seconds with a colloidal silica slurry having an average particle size of about 35 nm (Glanzox-3103).

A second set of silicon wafers (200 mm) were also single-side polished with the polishing slurry containing polymer-encapsulated colloidal silica particles with 80% silica (colloidal silica—23.6 wt % (Nalco DVSTS029); DI water—76.4 wt %; 31 wt % $H_2O_2$-$2.7 \times 10^{-4}$ wt %) for about 140 seconds.

The second set of wafers were then single-side polished for about 127 seconds with a polishing slurry containing a first set of silica particles containing 80% silica (Nalco DVSTS029) and a second set of silica particles containing about 5% silica (with the remainder being polymer) with an average particle size of about 35 nm (Glanzox-3103). The polishing slurry was prepared by piping the slurry of the first polishing step and the commercial 35 nm suspension to the polishing pad where the slurries combined at the pad. The weight ratio between the silica particles of the first set and the second set (including silica and polymer) was about 1:1.

The second set of wafers were then single-side polished for 30 seconds with a colloidal silica slurry having silica particles containing about 5 wt % silica and an average particles size of about 35 nm (Glanzox-3103).

A probability plot showing the ROA distribution for the two sets of wafers is shown in FIG. 6. The ROA was measured by forming a first order reference line at 90 mm and 94 mm and measuring the distance to the reference line at 96 mm. As shown in FIG. 6, the new polishing slurry improved ROA measured 96 mm by more than 25 nm (i.e., pushed the roll-off closer to the wafer circumferential edge).

Example 2: Effect of Polishing Slurry on ROA

Figure 7:
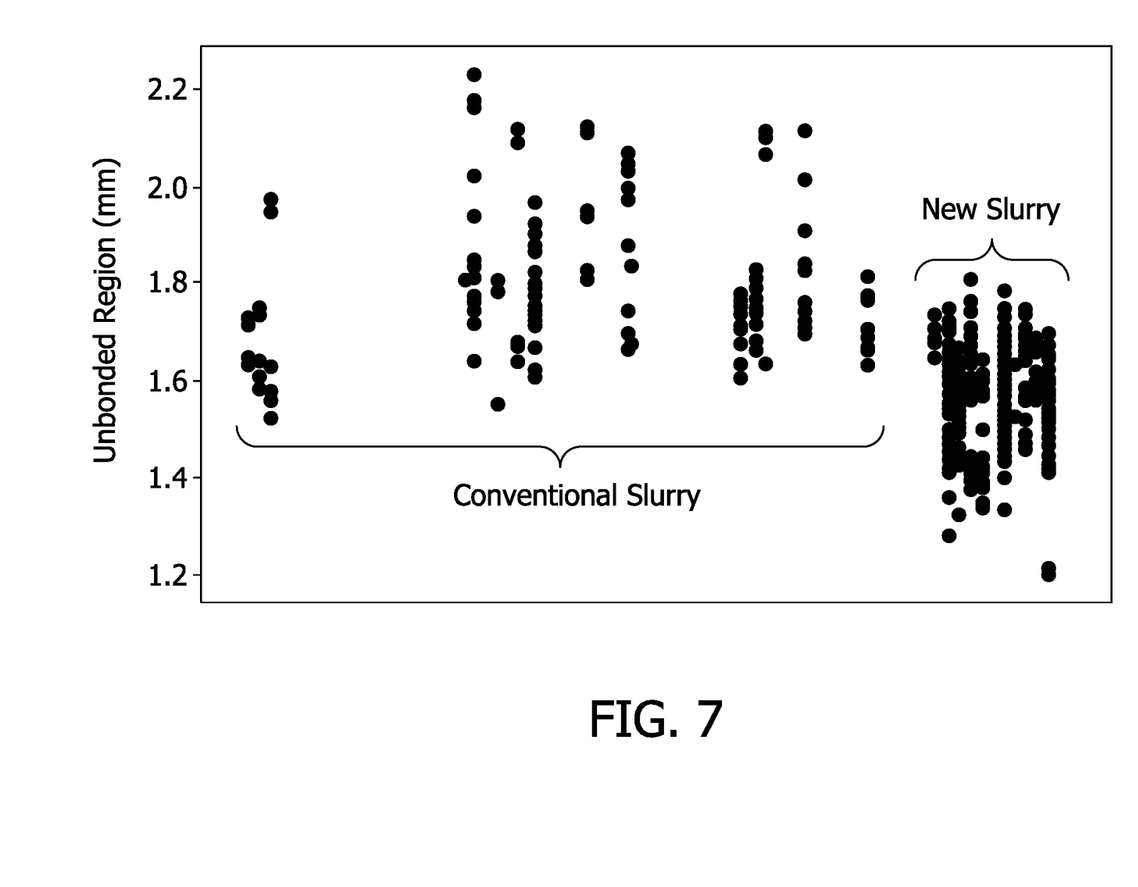
FIG. 7 is a graph showing the unbonded width of silicon on insulator structures produced according to Example 2.

The first set of wafers of Example 1 were used as donor and handle wafers to produce silicon on insulator structures (200 mm) having a $SiO_2$ dielectric layer. The second set of wafers were also used as donor and handle wafers to produce silicon on insulator structures (200 mm) having a $SiO_2$ dielectric layer. The unbonded region of the silicon on insulator structures made from the first set of wafers ("Conventional Slurry") and the second set of wafers (New Slurry") is shown in FIG. 7. The SOI structures made from donor and handle wafers polished by the new slurry had an unbonded region from about 1.2 mm to about 1.8 mm (about 98.8% to about 98.2% of the radius) while the silicon on insulator structures produced from donor and handle wafers polished by the conventional slurry recipe had a larger unbonded region of about 1.5 mm to about 2.2 mm (about 98.5% to about 97.8% of the radius).

Example 3: Effect of Polishing Time on Flatness and ROA

Figure 8:
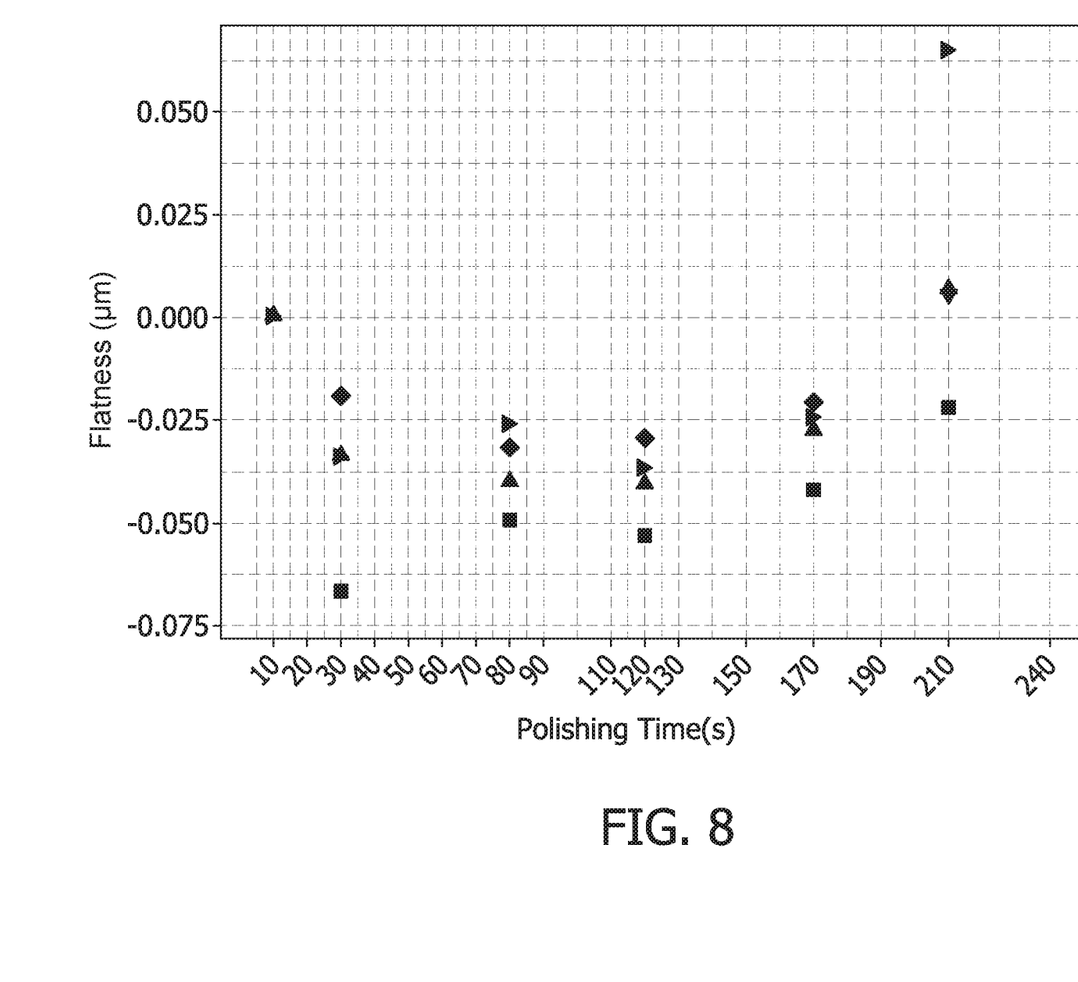
FIG. 8 is a graph showing the change in flatness between wafers produced with the polishing slurries of Example 3.
Figure 9:
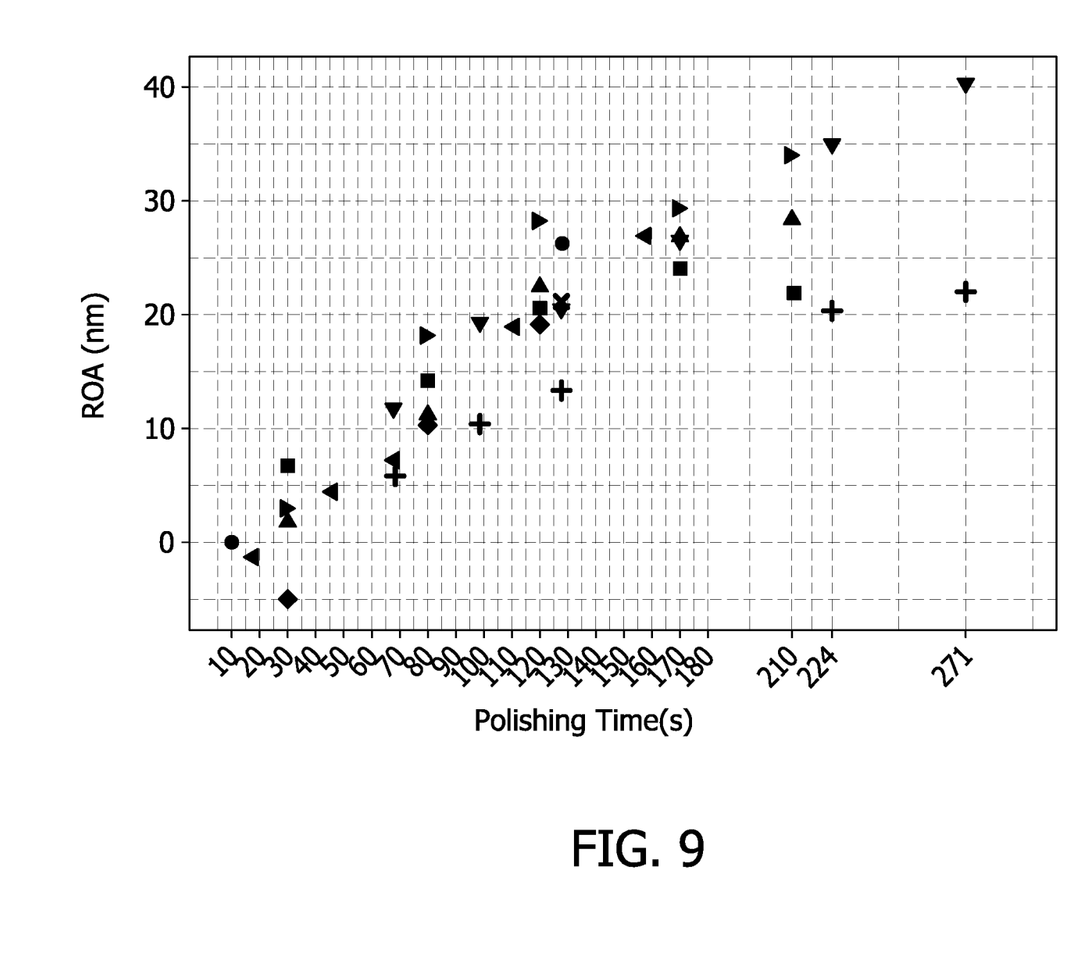
FIG. 9 is a graph showing the change in roll-off amount between wafers produced with the polishing slurries of Example 3.

Single crystal silicon wafers (200 mm) were single side polished with a polishing slurry containing colloidal silica particles with 80 wt % silica (colloidal silica—23.6 wt % (Nalco DVSTS029); DI water—76.4 wt %; 31 wt % $H_2O_2$—$2.7 \times 10^{-4}$ wt %) with an average particle diameter of about 30 nm for about 140 seconds. The wafers were then single-side polished with a polishing slurry containing a first set of silica particles containing about 80 wt % silica and an average particle diameter of about 30 nm (Nalco DVSTS029) and a second set of silica particles containing about 5 wt % silica with an average particle size of about 35 nm (Glanzox-3103). The polishing slurry was prepared by mixing the slurry of the first polish step with the commercial 35 nm suspension at the polishing pad. The weight ratio between the first set of silica particles and the second set (including silica and particles) was about 1:1. The polishing time with the second slurry was varied as shown in FIGS. 8 and 9. The second set of wafers was then single-side polished for 30 seconds with a colloidal silica slurry having silica particles with about 5 wt % silica (Glanzox-3103).

The flatness (SFQR) of the wafers was determined and compared to the average flatness of wafers polished by the conventional recipe of Example 1. The change in flatness is shown in FIG. 8. Wafer flatness improved initially with additional polishing time and worsened at about 210 seconds.

The roll-off amount of the wafers was also determined and compared to the average ROA of wafers polished by the conventional recipe of Example 1. The change in ROA is shown in FIG. 9. FIG. 9 shows a positive number ROA change for most samples which indicates the ROA of wafers polished by the new slurry improved (i.e., was a smaller negative number). As shown in FIG. 9, the ROA improved with longer polishing times.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for polishing a semiconductor substrate having a front surface and a back surface generally parallel to the front surface, the method comprising contacting the front surface of the substrate with a polishing pad in the presence of a polishing slurry, the polishing slurry comprising:
    a first set of silica particles, the first set of silica particles being polymer-encapsulated and having a silica content of $X_1$ wt %; and
    a second set of silica particles, the second set of silica particles being polymer-encapsulated and having a silica content of $X_2$ wt %, wherein $X_2$ is greater than $X_1$, wherein the weight ratio of the first set of silica particles to the second set of silica particles is from about 5:1 to about 1:5.

2. The method as set forth in claim 1 wherein the back surface is not polished while polishing the front surface and wherein at least about 5 µm of material is removed from the front surface of the substrate.

3. The method as set forth in claim 1 wherein the substrate has a diameter of about 200 mm.

4. The method as set forth in claim 1 wherein the ratio of $X_2$ to about $X_1$ is at least about 2:1.

5. The method as set forth in claim 1 wherein the first set of silica particles and the second set of silica particles each have an average diameter of less than about 100 nm and the difference between the average diameter of the first set of particles and the average diameter of the second set of particles is less than about 30 nm.

6. The method as set forth in claim 1 comprising polishing a population of wafers with the polishing slurry, wherein at least about 20% of the wafers have a roll-off amount of less than about −35 nm.

7. The method as set forth in claim 6 wherein the roll-off amount is defined by the following measurement protocol that is based on a thickness profile of the wafer:
    forming a reference line between a first discreet point and a second discreet point on the thickness profile, the first discreet point and second discreet point each being a distance from the central axis of the wafer, the distance between the first discreet point and the central axis of the wafer being about 90% of the radius of the wafer and the distance between the second discreet point and the central axis of the wafer being about 94% of the radius of the wafer; and
    measuring a distance between the reference line and a third discreet point on the wafer thickness profile, the distance between the third discreet point and the central axis of the wafer being about 96% of the radius of the wafer.

8. The method as set forth in claim 1 wherein the polishing slurry is a colloid.

9. The method as set forth in claim 1 wherein the polishing slurry is a second polishing slurry, the method comprising:
    contacting the front surface of the substrate with a polishing pad in the presence of a first polishing slurry consisting essentially of the second set of silica particles;
    contacting the front surface of the substrate with a polishing pad in the presence of the second polishing slurry, the second polishing slurry consisting essentially of the first set of silica particles and the second set of silica particles; and
    contacting the front surface of the substrate with a polishing pad in the presence of a third polishing slurry consisting essentially of the first set of silica particles.

10. A method for producing a silicon-on-insulator structure having a silicon device layer, a handle wafer and a dielectric layer between the device layer and the handle wafer, the method comprising:
    polishing a donor wafer or a handle wafer according to the method of claim 1;
    forming a dielectric layer on a front surface of at least one of the donor wafer and the handle wafer;
    bonding the dielectric layer to at least one of the donor wafer and the handle wafer to form a bonded structure; and
    cleaving the bonded structure such that a portion of the donor wafer remains bonded to the handle wafer to form the device layer.

11. The method as set forth in claim 10 wherein the substrate is not further polished between the polishing step and the bonding step.

12. The method as set forth in claim 10 wherein the handle wafer has a central axis and a diameter of about 200 mm, the silicon layer extending from the central axis of the handle wafer to about 98.2 mm from the central axis of the handle wafer.

\* \* \* \* \*